United States Patent
Dictus et al.

(10) Patent No.: US 10,106,737 B2
(45) Date of Patent: Oct. 23, 2018

(54) LIQUID MIXTURE AND METHOD FOR SELECTIVELY WET ETCHING SILICON GERMANIUM

(71) Applicant: Lam Research AG, Villach (AT)

(72) Inventors: Dries Dictus, Villach (AT); Christian Fischer, Riegersdorf (AT)

(73) Assignee: LAM RESEARCH AG, Villach (AT)

( * ) Notice: Subject to any disclaimer, the term of this patent is extended or adjusted under 35 U.S.C. 154(b) by 0 days.

(21) Appl. No.: 15/466,779

(22) Filed: Mar. 22, 2017

(65) Prior Publication Data
US 2018/0277379 A1 Sep. 27, 2018

(51) Int. Cl.
| | | |
|---|---|---|
| C09K 13/08 | (2006.01) | |
| H01L 21/306 | (2006.01) | |
| H01L 21/02 | (2006.01) | |
| C09K 13/00 | (2006.01) | |
| C09K 13/06 | (2006.01) | |
| H01L 21/3213 | (2006.01) | |

(52) U.S. Cl.
CPC ............. *C09K 13/08* (2013.01); *C09K 13/00* (2013.01); *C09K 13/06* (2013.01); *H01L 21/0217* (2013.01); *H01L 21/02164* (2013.01); *H01L 21/02381* (2013.01); *H01L 21/02428* (2013.01); *H01L 21/30604* (2013.01); *H01L 21/32134* (2013.01)

(58) Field of Classification Search
None
See application file for complete search history.

(56) References Cited

U.S. PATENT DOCUMENTS

| | | |
|---|---|---|
| 7,642,578 B2 | 1/2010 | Lee et al. |
| 8,796,157 B2 | 8/2014 | Wagner |
| 2005/0169096 A1* | 8/2005 | Lee .................. C09K 13/08 365/232 |

OTHER PUBLICATIONS

Carns, T. K., et al. "Chemical Etching of Si1-XGex in HF:H2O2:CH3COOH." J. Electrochem. Soc., vol. 142, No. 4, Apr. 1995, 7 pages.
Guder, et al. "Peracetic Acid as Active Species in Mixtures for Selective Etching of SiGe/Si Layer Systems—Aspects of Chemistry and Analytics." Solid State Phenomena, Trans Tech Publications, Nov. 20, 2007, www.scientific.net/SSP.134.79, 4 pages.
Kim, Dong Hyun, and Hee Chul Lee. Selective Lateral Etching of Al0.3Ga0.7AS/GaAs Heterojunction Structure Using the Redox Solution of I2/KI. Mar. 1, 1997. Jpn. J. Appl. Phys. vol. 36 (1997), 3 pages.

(Continued)

*Primary Examiner* — Jiong-Ping Lu

(57) ABSTRACT

A liquid mixture for etching a substrate includes a first liquid comprising one of: (i) percarboxylic acid comprising 3 to 70 mass. % of the liquid mixture; or (ii) carboxylic acid comprising 3 to 70 mass. % of the liquid mixture and at least one liquid selected from a group consisting of hydrogen peroxide comprising 3 to 30 mass. % of the liquid mixture and ozone comprising 0.5 to 5 mass. % of the liquid mixture; a water drawing agent comprising 2 to 40 mass. % of the liquid mixture; hydrofluoric acid comprising 0.05 to 3 mass. % of the liquid mixture; and water comprising 0 to 60 mass. % of the liquid mixture. The liquid mixture may be used to etch silicon germanium relative to silicon, silicon dioxide and silicon nitride.

16 Claims, 2 Drawing Sheets

(56) References Cited

OTHER PUBLICATIONS

H. Mertens et al., "Gate-All-Around MOSFETs Based on Vertically Stacked Horizontal Si Nanowires in a Replacement Metal Gate Process on Bulk Si Substrates," 2016 IEEE Symposium on VLSI Technology, Honolulu, HI, 2016, pp. 1-2.

H. Mertens et al., "Vertically stacked gate-all-around Si nanowire CMOS transistors with dual work function metal gates," 2016 IEEE International Electron Devices Meeting (IEDM), San Francisco, CA, 2016, pp. 19.7.1-19.7.4.

Taraschi, Gianni, et al. "Strained Si, SiGe, and Ge on-Insulator: Review of Wafer Bonding Fabrication Techniques." Solid-State Electronics, Pergamon, Apr. 9, 2004, www.sciencedirect.com/science/article/pii/S0038110104000541. 9 pages.

* cited by examiner

LIQUID MIXTURE AND METHOD FOR SELECTIVELY WET ETCHING SILICON GERMANIUM

FIELD

The present disclosure relates to a liquid mixture for etching and more particularly to methods for selectively wet etching silicon germanium relative to other materials using the liquid mixture.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to deposit, etch and otherwise treat materials on substrates such as semiconductor wafers. Examples of etching processes include dry etching, vapor etching and/or wet etching. In some examples, one exposed material of the substrate may need to be etched selectively relative to one or more other exposed materials of the substrate.

In one application, silicon germanium (SiGe) needs to be etched selectively relative to silicon (Si), silicon nitride (SiN or $Si_3N_4$) and silicon dioxide ($SiO_2$) to reveal Si nanowires. When selecting the etching process, selectivity between Si and SiGe is a primary consideration. However, there should also be sufficient selectivity to avoid material loss of other materials such as $SiO_2$ and SiN. For example, material loss constraints for the 7 nm technology node (and smaller nodes where the Si nanowires may be used) should be less than 10-20 Å for Si and $SiO_2$ and less than 10 Å for SiN.

When using dry etching processes, there is limited selectivity between SiGe and Si, which causes material loss on the Si nanowire. Vapor etching processes using hydrochloric acid (HCl) are slow and typically require a minimum of 30 minutes of processing time. Both techniques are followed by a wet process (such as a wet clean process using dilute hydrofluoric acid (HF)) and a channel oxidation process, which is typically performed using wet treatment with water and ozone.

When using wet etching processes to etch SiGe, it is very challenging to provide sufficient selectivity such that only SiGe is etched while Si, $SiO_2$ and/or SiN are not etched. Existing chemistries for selectively etching SiGe relative to Si do not have sufficient selectivity relative to $SiO_2$ and SiN.

SUMMARY

A liquid mixture for etching a substrate includes a first liquid comprising one of: (i) percarboxylic acid comprising 3 to 70 mass. % of the liquid mixture; or (ii) carboxylic acid comprising 3 to 70 mass. % of the liquid mixture and at least one liquid selected from a group consisting of hydrogen peroxide comprising 3 to 30 mass. % of the liquid mixture and ozone comprising 0.5 to 5 mass. % of the liquid mixture; a water drawing agent comprising 2 to 40 mass. % of the liquid mixture; hydrofluoric acid comprising 0.05 to 3 mass. % of the liquid mixture; and water comprising 0 to 60 mass. % of the liquid mixture.

In other features, the water drawing agent comprises sulfuric acid. The carboxylic acid is selected from a group consisting of acetic acid, formic acid, propionic acid and butyric acid. The percarboxylic acid is selected from a group consisting of peracetic acid, performic acid, perpropionic acid, and perbutyric acid. The percarboxylic acid comprises 10 to 55 mass. % of the liquid mixture. The carboxylic acid comprises acetic acid.

In other features, the carboxylic acid comprises 10 to 55 mass. % of the liquid mixture. The hydrogen peroxide comprises 6 to 20 mass. % of the liquid mixture. The water drawing agent comprises 2 to 40 mass. % of the liquid mixture. The hydrofluoric acid comprises 0.1 to 1.5 mass. % of the liquid mixture. The water comprises 5 to 50 mass. % of the liquid mixture.

In other features, the method includes providing a substrate comprising silicon germanium, silicon and at least one material selected from a group consisting of silicon dioxide and silicon nitride; and selectively etching the silicon germanium relative to the silicon and the at least one material by applying the liquid mixture of claim 1 to the substrate.

A method for wet etching a substrate, comprising providing a substrate comprising silicon germanium and at least one material selected from a group consisting of silicon, silicon dioxide and silicon nitride; and selectively etching the silicon germanium relative to the at least one material by applying the liquid mixture to the substrate.

A method for wet etching a substrate includes arranging the substrate on a spin chuck. The substrate comprises silicon germanium and at least one material selected from a group consisting of silicon, silicon dioxide and silicon nitride. The method includes rotating the substrate using the spin chuck; and applying the liquid mixture onto at least one surface of the substrate to selectively etch the silicon germanium relative to the at least one material by applying the liquid mixture.

In other features, the silicon germanium is etched at a ratio greater than or equal to 10:1 relative to the at least one material selected from a group consisting of silicon, silicon dioxide and silicon nitride. The silicon germanium is etched at a ratio greater than or equal to 10:1 relative to the silicon material, the silicon dioxide material and the silicon nitride material.

A liquid mixture for etching silicon germanium includes carboxylic acid comprising 3 to 12 mol/L of the liquid mixture; hydrogen peroxide comprising 1.5 to 7 mol/L of the liquid mixture; sulfuric acid 0.5 to 5 mol/L of the liquid mixture; hydrofluoric acid comprising 0.1 to 1 mol/L of the liquid mixture; and water comprising 4 to 50 mol/L of the liquid mixture.

In other features, a molarity of the carboxylic acid is higher than a molarity of hydrogen peroxide.

A method for wet etching a substrate includes providing a substrate comprising silicon germanium, silicon and at least one material selected from a group consisting of silicon dioxide and silicon nitride; and selectively etching the silicon germanium relative to the at least one material using the liquid mixture.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1A:
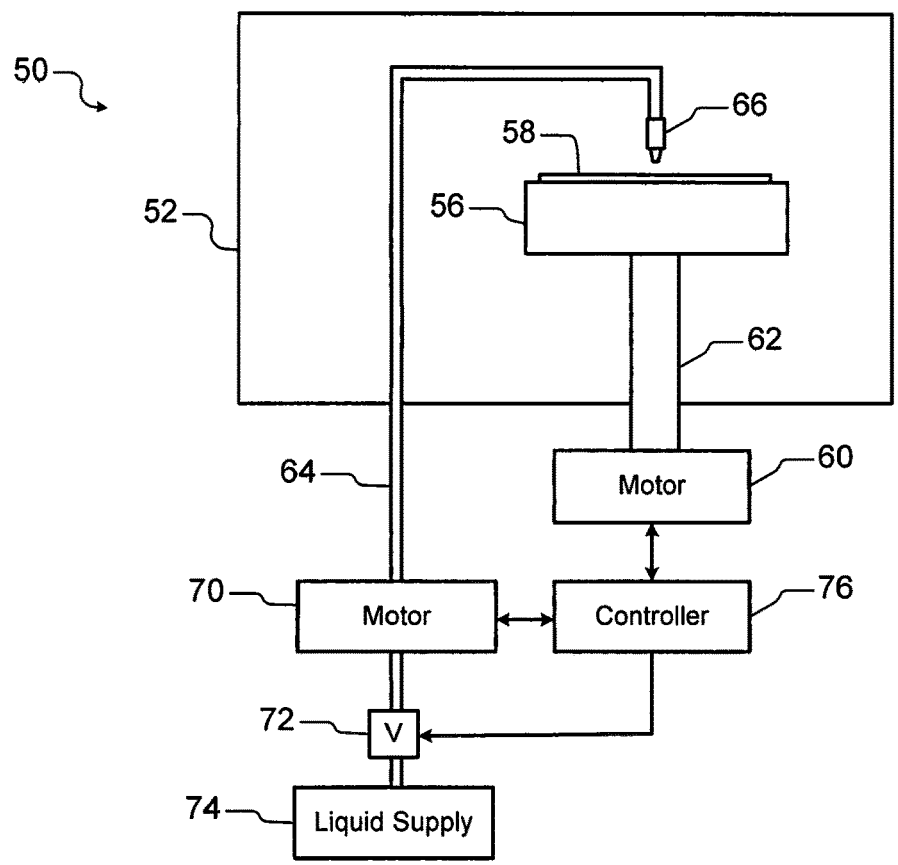
FIG. 1A is a functional block diagram of an example of a spin chuck configured to apply a liquid mixture according to the present disclosure to selectively etch silicon germanium (SiGe).

The present disclosure relates to a liquid mixture for wet etching a substrate to selectively etch silicon germanium (SiGe) relative to one or more other exposed materials and methods for applying the liquid mixture to a substrate. As used herein SiGe refers to any alloy containing silicon and germanium. In some examples, the other materials include silicon (Si), silicon dioxide ($SiO_2$) and/or silicon nitride (SiN). The present disclosure also relates to the use of the liquid mixture to selectively etch SiGe on a substrate using a spin chuck.

In some examples, a liquid mixture for etching a substrate includes a first liquid comprising one of (i) percarboxylic acid comprising 3 to 70 mass. % of the liquid mixture; or (ii) carboxylic acid comprising 3 to 70 mass. % of the liquid mixture and at least one liquid selected from a group consisting of hydrogen peroxide comprising 3 to 30 mass. % of the liquid mixture and ozone comprising 0.5 to 5 mass. % of the liquid mixture. The liquid mixture further includes a water drawing agent comprising 2 to 40 mass. % of the liquid mixture. The liquid mixture further includes hydrofluoric acid comprising 0.05 to 3 mass. % of the liquid mixture and water comprising 0 to 60 mass. % of the liquid mixture.

In some examples, the water drawing agent comprises sulfuric acid. In some examples, the carboxylic acid is selected from a group consisting of acetic acid, formic acid, propionic acid and butyric acid. In some examples, the carboxylic acid comprises acetic acid. In some examples, the carboxylic acid comprises 10 to 55 mass. % of the liquid mixture.

In some examples, the percarboxylic acid is selected from a group consisting of peracetic acid, performic acid, perpropionic acid, and perbutyric acid. The percarboxylic acid comprises 10 to 55 mass. % of the liquid mixture.

In some examples, the hydrogen peroxide comprises 6 to 20 mass. % of the liquid mixture. In some examples, the water drawing agent comprises 2 to 40 mass. % of the liquid mixture. In some examples, the hydrofluoric acid comprises 0.1 to 1.5 mass. % of the liquid mixture. In some examples, the water comprises 5 to 50 mass. % of the liquid mixture.

Another liquid mixture for etching comprises 3 to 12 mol/L carboxylic acid; 1.5 to 7 mol/L hydrogen peroxide; 0.5 to 5 mol/L sulfuric acid; 0.1 to 1 mol/L hydrofluoric acid; and 4 to 50 mol/L water. In some examples, a molarity of the carboxylic acid is higher than a molarity of hydrogen peroxide. Another method for wet etching a substrate includes providing a substrate comprising silicon germanium at least one material selected from a group consisting of silicon, silicon dioxide and silicon nitride. The method includes selectively etching the silicon germanium relative to the at least one material using the liquid mixture.

For example only, the liquid mixture may include both acetic acid (HAc) and peroxide ($H_2O_2$) to form peracetic acid. The peracetic acid in the liquid mixture provides etch selectivity of SiGe over Si. In some examples, a water withdrawing agent such as sulfuric acid is added to the liquid mixture to increase the rate of peracetic acid formation so that a stable mixture can be obtained in about an hour instead of over several hours. The water withdrawing agent also lowers the etch rate of $SiO_2$ and SiN. Lower sulfuric acid concentration is possible at the expense of reaction rate and material selectivity. Depending on the Si nanowire dimensions, the hydrofluoric acid (HF) can be used to change the SiGe etch rate.

In some examples, the liquid mixture comprises a ratio by volume of 15:15:0.16:4 of respectively HAc(99%):$H_2O_2$(30%):HF(49%):$H_2SO_4$(96%). Molarities for this example of the liquid mixture include 7.6M HAc, 4.3M $H_2O_2$, 0.13M HF, 2.15M $H_2SO_4$ and 20M $H_2O$.

The liquid mixture according to the present disclosure provides the desired etch selectivity. In some examples, the SiGe is etched at a ratio greater than or equal to 10:1 relative to Si, $SiO_2$ and/or SiN. In some examples, the SiGe is etched at a ratio greater than or equal to 10:1 relative to Si, $SiO_2$ and/or SiN.

The etch process described herein is relatively short (on the order of seconds/minutes) and can be followed in-situ by other steps to remove a thin $SiO_2$ layer on Si (to expose bare Si) and to oxidize the Si in water/ozone to grow a controlled channel oxide.

Figure 1B:
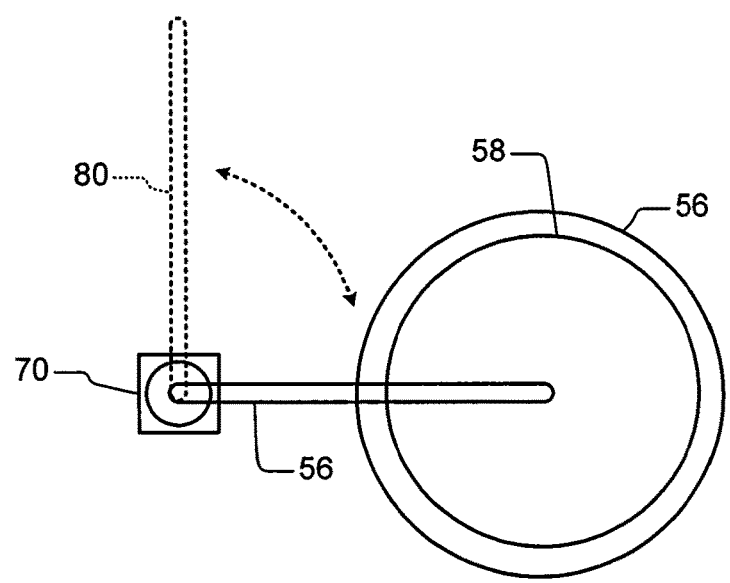
FIG. 1B is a plan view of the spin chuck of FIG. 1A.

Referring now to FIGS. 1 and 1B, a spin chuck 50 that may be used to deliver the liquid mixture to selectively etch silicon germanium relative to silicon, silicon dioxide and/or silicon nitride is shown. In FIG. 1A, the spin chuck 50 includes a processing chamber 52 and a rotatable chuck 56 supporting a substrate 58. A motor 60 rotates a shaft 62 connected to the rotating chuck 56. A liquid delivery arm 64 and a nozzle 66 deliver liquid to a surface of the substrate 58 as the motor 60 rotates the shaft 62 connected to the rotatable chuck 56. A valve 72 controls delivery of one or more liquids such as deionized (DI) water, the liquid mixture described above and/or other liquids from a liquid supply 74. A controller 76 may be used to control the motor 60, a motor 70 and the valve 72 during etching. In FIG. 1B, a rotational position of the liquid delivery arm 64 may be adjusted from a dispensing position to a storage position shown in dotted lines using the motor 70.

Figure 2:
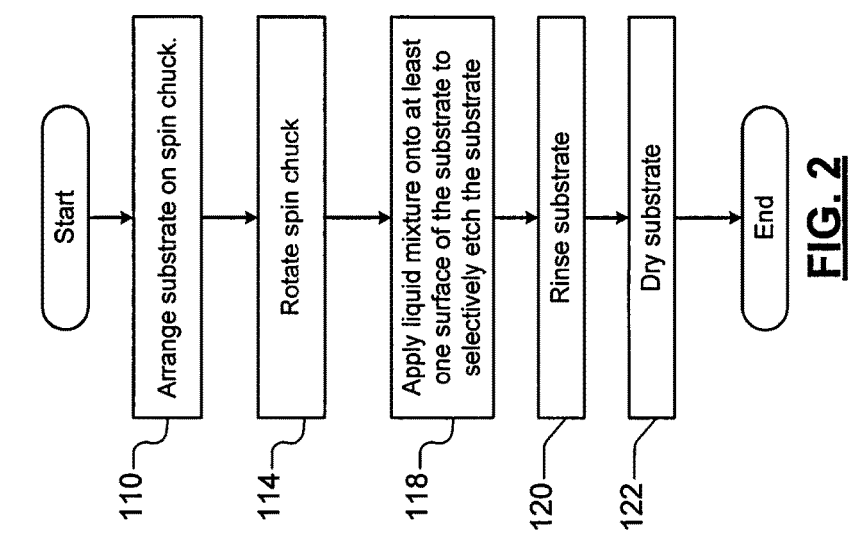
FIG. 2 is a flowchart illustrating an example of a method for etching a substrate using the liquid mixture according to the present disclosure.

Referring now to FIG. 2, a method 100 for wet etching a substrate includes providing a substrate and arranging the substrate on a spin chuck at 110. In some examples, the substrate includes a SiGe and at least one material selected from a group consisting of Si, $SiO_2$ and/or SiN. In some examples, the substrate is etched to expose nanowires as will be described below. The method includes rotating the substrate using the spin chuck at 114. At 118, the method includes applying the liquid mixture onto at least one surface of the substrate. The liquid mixture selectively etches the SiGe relative to the at least one material. In some examples, the substrate 58 is rinsed at 120 after etching using the liquid mixture with water (such as deionized water (DI) water). After rinsing, the substrate 58 may be dried at 122.

In some examples, the rotatable chuck 58 is rotated at a speed greater than or equal to 50 rpm. In other examples, the rotatable chuck 58 is rotated at a speed greater than or equal to 300 rpm. In other examples, the rotatable chuck 58 is rotated at a speed of 1000 rpm. In some example, the liquid mixture is dispensed as a free flowing liquid onto the substrate 58. In some examples, the liquid mixture is dispensed at a temperature in a range from 10-40° C. (e.g. 25° C.).

Figure 3A:
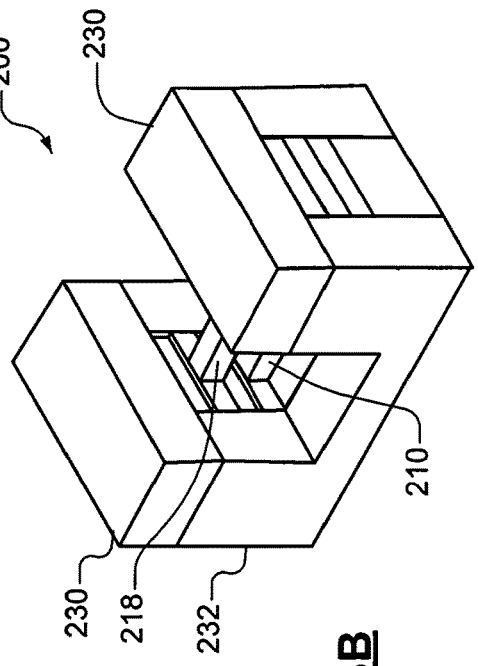
FIGS. 3A and 3B are perspective views illustrating an example of a substrate etched to expose nanowires.
Figure 3B:
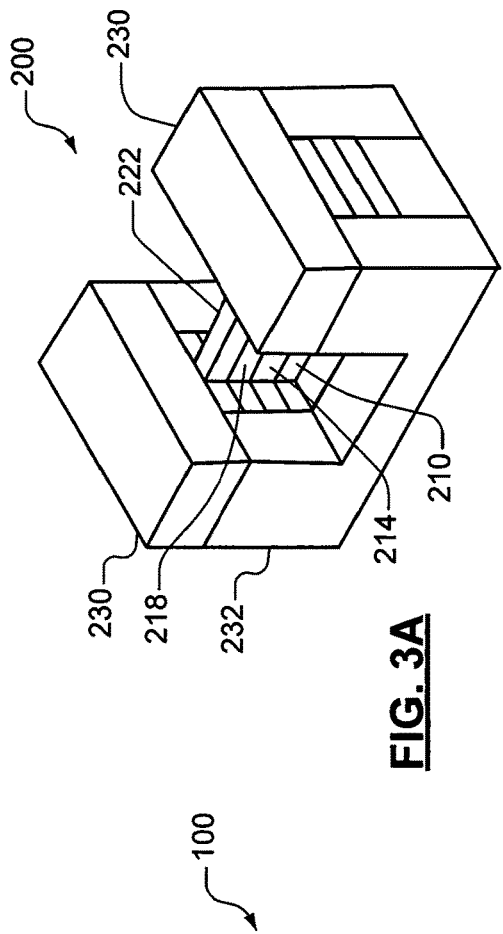

Referring now to FIGS. 3A and 3B, an example of a substrate 200 that is etched to release nanowires is shown. In FIG. 3A, a substrate 200 includes a silicon substrate 210. A silicon germanium layer 214 is arranged on the silicon substrate 210. An active silicon layer 218 is arranged on the silicon germanium layer 214. A silicon germanium layer 222 is arranged on the active silicon layer 218. A silicon oxide layer 232 is arranged at opposite sides of the substrate. A silicon nitride mask 230 is arranged above the silicon germanium layer 222. To expose the active silicon layer 218, an etch process using the liquid mixture described above may be used.

In FIG. 3B, the substrate 200 is shown after the etch process is performed using the liquid mixture. The silicon germanium layers 214 and 222 are removed to expose the active silicon layer 218. Additional etching and/or annealing may be performed to transform a profile of the active silicon layer 222 to a round cross-sectional shape.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A liquid mixture for etching a substrate, comprising:
   a first liquid comprising carboxylic acid comprising 3 to 12 mol/L of the liquid mixture and hydrogen peroxide comprising 1.5 to 7 mol/L of the liquid mixture;
   sulfuric acid comprising 0.5 to 5 mol/L of the liquid mixture;
   hydrofluoric acid comprising 0.1 to 1 mol/L of the liquid mixture; and
   water comprising 4 to 40 mol/L of the liquid mixture.

2. The liquid mixture of claim 1, wherein the carboxylic acid comprises acetic acid.

3. The liquid mixture of claim 1, wherein the carboxylic acid comprises 7.6 mol/L of the liquid mixture.

4. The liquid mixture of claim 1, wherein the hydrogen peroxide comprises 4.3 mol/L of the liquid mixture.

5. The liquid mixture of claim 1, wherein the sulfuric acid comprises 2.15 mol/L of the liquid mixture.

6. The liquid mixture of claim 1, wherein the hydrofluoric acid comprises 0.13 mol/L of the liquid mixture.

7. The liquid mixture of claim 1, wherein the water comprises 20 mol/L of the liquid mixture.

8. A method for wet etching a substrate, comprising:
   providing a substrate comprising silicon germanium, silicon and at least one material selected from a group consisting of silicon dioxide and silicon nitride; and
   selectively etching the silicon germanium relative to the silicon and the at least one material by applying the liquid mixture of claim 1 to the substrate.

9. A method for wet etching a substrate, comprising:
   providing a substrate comprising silicon germanium and at least one material selected from a group consisting of silicon, silicon dioxide and silicon nitride; and
   selectively etching the silicon germanium relative to the at least one material by applying the liquid mixture of claim 1 to the substrate.

10. The method of claim 9, wherein the substrate includes nanowires that are exposed after etching of the silicon germanium.

11. A method for wet etching a substrate, comprising:
   arranging the substrate on a spin chuck, wherein the substrate comprises silicon germanium and at least one material selected from a group consisting of silicon, silicon dioxide and silicon nitride;
   rotating the substrate using the spin chuck; and
   applying the liquid mixture of claim 1 onto at least one surface of the substrate to selectively etch the silicon germanium relative to the at least one material by applying the liquid mixture.

12. The method of claim 11, wherein the silicon germanium is etched at a ratio greater than or equal to 10:1 relative to the at least one material selected from a group consisting of silicon, silicon dioxide and silicon nitride.

13. The method of claim 11, wherein the silicon germanium is etched at a ratio greater than or equal to 10:1 relative to the silicon material, the silicon dioxide material and the silicon nitride material.

14. A liquid mixture for etching silicon germanium comprising:
   carboxylic acid comprising 3 to 12 mol/L of the liquid mixture;
   hydrogen peroxide comprising 1.5 to 7 mol/L of the liquid mixture;
   sulfuric acid 0.5 to 5 mol/L of the liquid mixture;
   hydrofluoric acid comprising 0.1 to 1 mol/L of the liquid mixture; and
   water comprising 4 to 50 mol/L of the liquid mixture.

15. The liquid mixture of claim 14, wherein a molarity of the carboxylic acid is higher than a molarity of hydrogen peroxide.

16. A method for wet etching a substrate, comprising:
   providing a substrate comprising silicon germanium, silicon and at least one material selected from a group consisting of silicon dioxide and silicon nitride; and
   selectively etching the silicon germanium relative to the at least one material using the liquid mixture of claim 14.

* * * * *